US012672448B2

(12) United States Patent (10) Patent No.: US 12,672,448 B2
Jin et al. (45) Date of Patent: Jun. 30, 2026

(54) DISPLAY PANEL AND DISPLAY APPARATUS INCLUDING THE DISPLAY PANEL

(71) Applicant: KunShan Go-Visionox Opto-Electronics Co., Ltd, Kunshan (CN)

(72) Inventors: Yu Jin, Kunshan (CN); Lei Xu, Kunshan (CN); Weijie Gu, Kunshan (CN); Zhiyi Zhou, Kunshan (CN); Zheyu Meng, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 395 days.

(21) Appl. No.: 18/475,543

(22) Filed: Sep. 27, 2023

(65) Prior Publication Data

US 2024/0023398 A1     Jan. 18, 2024

Related U.S. Application Data

(63) Continuation of application No. PCT/CN2022/107753, filed on Jul. 26, 2022.

(30) Foreign Application Priority Data

Dec. 21, 2022   (CN) .......................... 202111569379.4

(51) Int. Cl.
| *H10K 59/131* | (2023.01) |
| *H10K 59/12* | (2023.01) |
| *H10K 59/65* | (2023.01) |

(52) U.S. Cl.
CPC ....... *H10K 59/131* (2023.02); *H10K 59/1201* (2023.02); *H10K 59/65* (2023.02)

(58) Field of Classification Search
CPC .. H10K 59/12; H10K 59/1201; H10K 59/131; H10K 59/353; H10K 59/60; H10K 59/65
See application file for complete search history.

(56) References Cited

U.S. PATENT DOCUMENTS

| 2021/0158004 A1 | 5/2021 | Lian | |
| 2023/0108100 A1* | 4/2023 | Park ..................... | H10K 59/122 |
| | | | 257/40 |

FOREIGN PATENT DOCUMENTS

| CN | 103219469 A | 7/2013 |
| CN | 108288455 A | 7/2018 |

(Continued)

OTHER PUBLICATIONS

International Search Report issued on Oct. 10, 2022, in corresponding International Application No. PCT/CN2022/107753; 5 pages.

(Continued)

*Primary Examiner* — Nelson Garces
(74) *Attorney, Agent, or Firm* — Maier & Maier, PLLC

(57) ABSTRACT

A display panel and a display apparatus. The display panel includes: a base plate, an interconnection structure including at least two connection blocks and connection lines for connecting the at least two connection blocks; and a plurality of first sub-pixels located at a side of the interconnection structure away from the base plate and each including a first electrode, a first light-emitting structure and a second electrode stacked in sequence along a direction away from the interconnection structure; in which at least a part of the first electrode is located at a side of the connection block away from the base plate and electrically connected with the connection block, and an orthographic projection of the connection block on the base plate is at least partially staggered with an orthographic projection of the first light-emitting structure on the base plate.

15 Claims, 7 Drawing Sheets

(56) References Cited

FOREIGN PATENT DOCUMENTS

| | | | |
|---|---|---|---|
| CN | 110890026 | A | 3/2020 |
| CN | 210200763 | U | 3/2020 |
| CN | 111477635 | A | 7/2020 |
| CN | 111834400 | A | 10/2020 |
| CN | 111834538 | A | 10/2020 |
| CN | 112258987 | A | 1/2021 |
| CN | 112310325 | A | 2/2021 |
| CN | 109872999 | A | 6/2021 |
| CN | 111834538 | B | 7/2021 |
| CN | 113140609 | A | 7/2021 |
| CN | 113421904 | A | 9/2021 |
| CN | 113488601 | A | 10/2021 |
| CN | 113658995 | A | 11/2021 |
| CN | 114400239 | A | 4/2022 |
| KR | 1020200100182 | A | 8/2020 |
| KR | 1020210041675 | A | 4/2021 |
| KR | 1020210133303 | A | 11/2021 |
| KR | 1020210138780 | A | 11/2021 |
| WO | 2021169571 | A1 | 9/2021 |

OTHER PUBLICATIONS

Office Action issued on Oct. 31, 2022, in corresponding Chinese Application No. 202111569379.4; 19 pages.

Notice of Registration issued on Jan. 29, 2023, in corresponding Chinese Application No. 202111569379.4; 7 pages.

Office Action issued on Jul. 22, 2025, in corresponding Korean Application No. 10-2023-7034493, 13 pages.

Notice of Allowance issued on Apr. 9, 2026, in corresponding Korean Application No. 10-2023-7034493, 4 pages.

* cited by examiner

AA2          AA1        NA

Q

100

AA2                              AA1

50          60      40                    30

B                                    B        Q

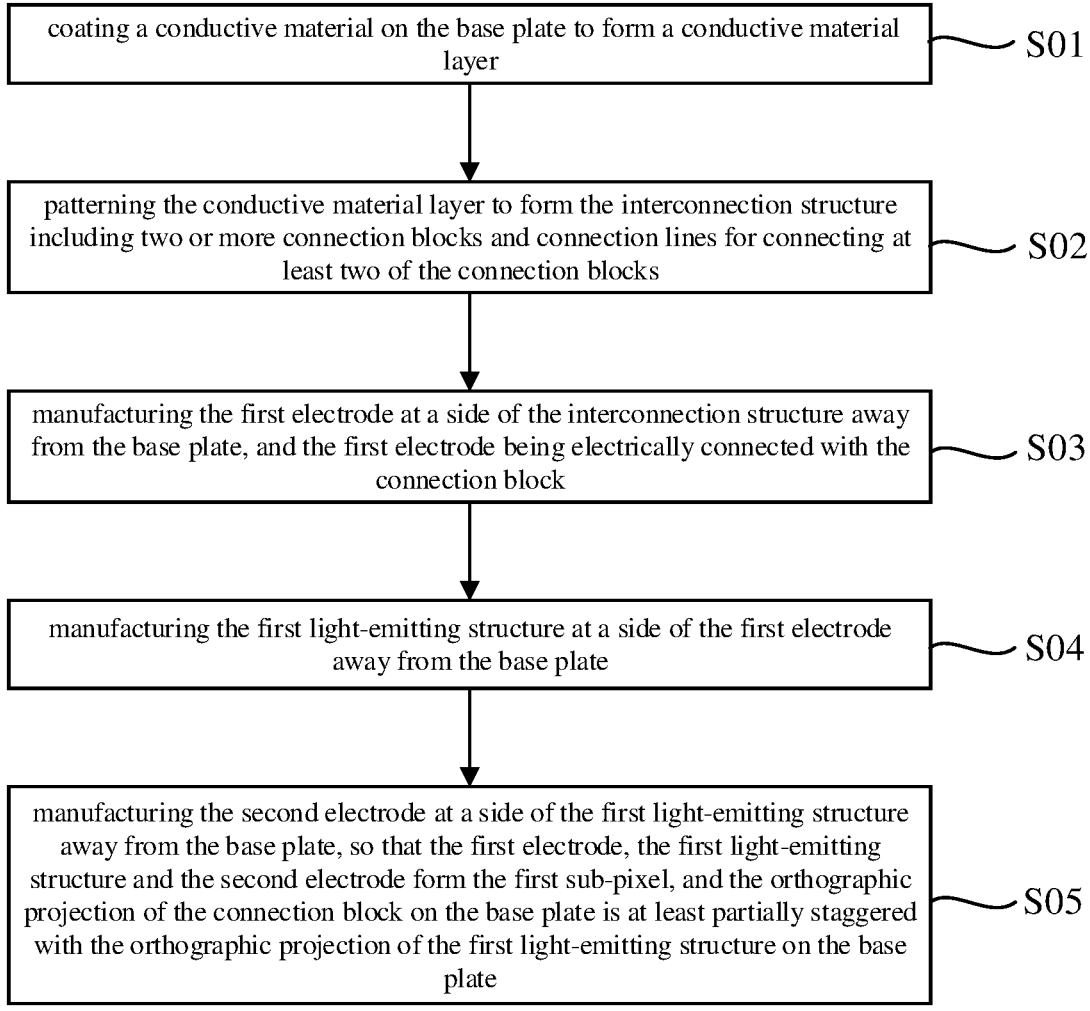

coating a conductive material on the base plate to form a conductive material layer — S01 patterning the conductive material layer to form the interconnection structure including two or more connection blocks and connection lines for connecting at least two of the connection blocks — S02 manufacturing the first electrode at a side of the interconnection structure away from the base plate, and the first electrode being electrically connected with the connection block — S03 manufacturing the first light-emitting structure at a side of the first electrode away from the base plate — S04 manufacturing the second electrode at a side of the first light-emitting structure away from the base plate, so that the first electrode, the first light-emitting structure and the second electrode form the first sub-pixel, and the orthographic projection of the connection block on the base plate is at least partially staggered with the orthographic projection of the first light-emitting structure on the base plate — S05

Fig. 10

DISPLAY PANEL AND DISPLAY APPARATUS INCLUDING THE DISPLAY PANEL

CROSS-REFERENCE TO RELATED APPLICATION

The present application is a continuation of International Application No. PCT/CN2022/107753 filed on Jul. 26, 2022, which claims priority to Chinese Patent Application No. 202111569379.4 filed on Dec. 21, 2021, both of which are incorporated herein by reference in their entireties.

TECHNICAL FIELD

The present application relates to the field of display, and particularly to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer need to integrate a front camera, a telephone receiver, an infrared sensing component and the like. In the prior art, a notch or a hole can be formed in the display screen so that external light can enter the photosensitive component under the screen through the notch or the hole. Nonetheless, these electronic devices do not achieve a real full-screen display, and cannot display an image in all areas of the entire screen. For example, the area corresponding to the front camera cannot display the image.

SUMMARY

Embodiments of the present application provide a display panel and a display apparatus, at least a part of the display panel can be light-transmitting and can be used to display, facilitating the under-screen integration of the photosensitive components.

Embodiments of a first aspect of the present application provide a display panel including: a base plate, an interconnection structure located at a side of the base plate and including at least two connection blocks and connection lines for connecting the at least two connection blocks; and a plurality of first sub-pixels located at a side of the interconnection structure away from the base plate and each including a first electrode, a first light-emitting structure and a second electrode stacked in sequence along a direction away from the interconnection structure; in which at least a part of the first electrode is located at a side of the connection block away from the base plate and electrically connected with the connection block, and an orthographic projection of the connection block on the base plate is at least partially staggered with an orthographic projection of the first light-emitting structure on the base plate.

According to implementations of the first aspect of the present application, the orthographic projection of the first light-emitting structure on the base plate is located within an orthographic projection of the first electrode on the base plate, and the orthographic projection of the connection block on the base plate is at least partially staggered with the orthographic projection of the first electrode on the base plate.

According to any of the foregoing implementations of the first aspect of the present application, the connection block includes a body portion and a hollow portion enclosed by the body portion, and an orthographic projection of the hollow portion on the base plate at least partially overlaps the orthographic projection of the first light-emitting structure on the base plate.

According to any of the foregoing implementations of the first aspect of the present application, the orthographic projection of the first light-emitting structure on the base plate is located within the orthographic projection of the hollow portion on the base plate.

According to any of the foregoing implementations of the first aspect of the present application, a distance between an edge of the orthographic projection of the first light-emitting structure on the base plate and an edge of the orthographic projection of the hollow portion on the base plate is in a range from 0.5 μm to 1.5 μm.

According to any of the foregoing implementations of the first aspect of the present application, an orthographic projection of the body portion on the base plate at least partially overlaps an orthographic projection of the first electrode on the base plate.

According to any of the foregoing implementations of the first aspect of the present application, the orthographic projection of the hollow portion on the base plate is located within an orthographic projection of the first electrode on the base plate.

According to any of the foregoing implementations of the first aspect of the present application, a distance between an edge of the orthographic projection of the hollow portion on the base plate and an edge of the orthographic projection of the first electrode on the base plate is in a range from 1.0 μm to 3.5 μm.

According to any of the foregoing implementations of the first aspect of the present application, an orthographic projection of the first electrode on the base plate is located within an area enclosed by an outer edge of the orthographic projection of the connection block on the base plate.

According to any of the foregoing implementations of the first aspect of the present application, a distance between an edge of the orthographic projection of the first electrode on the base plate and the outer edge of the orthographic projection of the connection block on the base plate is in a range from 1.0 μm to 3.0 μm.

According to any of the foregoing implementations of the first aspect of the present application, a material of at least one of the connection block and the connection line includes a light-transmitting conductive material.

According to any of the foregoing implementations of the first aspect of the present application, at least a portion of the connection block and the connection line are arranged in a same layer and made of a same material, and materials of the portion of the connection block and the connection line both include a light-transmitting material.

According to any of the foregoing implementations of the first aspect of the present application, the display panel includes a first display area and a second display area, a light transmittance of the first display area is greater than a light transmittance of the second display area, the interconnection structure and the first sub-pixels are located in the first display area, the display panel further includes a first driving circuit located in the second display area, and the interconnection structure is connected with the first driving circuit through the connection lines.

According to any of the foregoing implementations of the first aspect of the present application, the connection line is configured to connect four connection blocks, and first light-emitting structures corresponding to the four connection blocks emit lights of a same color.

Embodiments of a second aspect of the present application provide a display apparatus including the display panel of any of the foregoing implementations.

Embodiments of a third aspect of the present application provide a method for manufacturing a display panel, and the method includes: coating a conductive material on a base plate to form a conductive material layer; patterning the conductive material layer to form an interconnection structure including at least two connection blocks and connection lines for connecting the at least two connection blocks; manufacturing a first electrode at a side of the interconnection structure away from the base plate, and the first electrode being electrically connected with the connection block; manufacturing a first light-emitting structure at a side of the first electrode away from the base plate; and manufacturing a second electrode at a side of the first light-emitting structure away from the base plate, so that the first electrode, the first light-emitting structure and the second electrode form a first sub-pixel, and an orthographic projection of the connection block on the base plate is at least partially staggered with an orthographic projection of the first light-emitting structure on the base plate.

In the display panel according to the embodiments of the present application, the display panel includes the base plate, and the interconnection structure and the first sub-pixels arranged on the base plate. The connection blocks of the interconnection structure are configured to connect the first electrodes of the first sub-pixels, and the connection lines of the interconnection structure are configured to connect at least two connection blocks, so that the first electrodes of at least two first sub-pixels can be connected with each other through the interconnection structure. When a driving circuit is used to drive the first sub-pixels, the driving circuit can be connected with at least two first sub-pixels through the interconnection structure, therefore the number of the driving circuits to be arranged can be reduced and the light transmittance of the display panel can be increased, so that at least a part of the display panel can be light-transmitting and can be used to display, facilitating the under-screen integration of the photosensitive components. In addition, the orthographic projection of the connection block is at least partially staggered with the orthographic projection of the first light-emitting structure, so that the effect on display due to adding the connection blocks can be reduced, and the display effect of the display panel can be improved.

BRIEF DESCRIPTION OF THE DRAWINGS

Other features, objects and advantages of the present application will become more apparent from reading the following detailed description of the non-limiting embodiments with reference to the accompanying drawings, in which the same or similar reference numerals represent the same or similar features, and the accompanying drawings are not drawn to actual scale.

FIG. 10 shows a flow diagram of a method for manufacturing a display panel according to the embodiments of the present application.

REFERENCE NUMERALS

Figure 1:
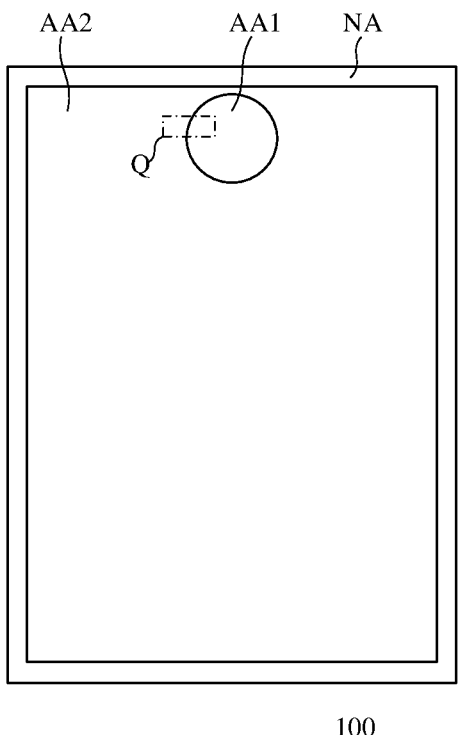
FIG. 1 shows a schematic top view of a display panel according to the embodiments of the present application.

100: Display panel; 200: Photosensitive module; S1: First surface; S2: Second surface;

10: Base plate;

20: Interconnection structure; 210: Connection block; 211: Body portion; 212: Hollow portion; 220: Connection line;

30: First sub-pixel; 310: First electrode; 320: Second electrode; 330: First light-emitting structure;

40: First driving circuit;

50: Second sub-pixel; 510: Third electrode; 520: Fourth electrode; 530: Second light-emitting structure;

60: Second driving circuit;

70: Pixel definition layer; K1: First pixel opening; K2: Second pixel opening;

AA1: First display area; AA2: Second display area.

DETAILED DESCRIPTION

Features and exemplary embodiments of various aspects of the present application will be described in detail below. In order to make the purpose, technical solutions and advantages of the present application clearer, the present application is described in further detail below in combination with the accompanying drawings and specific embodiments. It should be understood that the specific embodiments described herein are only used to explain the present application, but not to limit the present application. For those skilled in the art, the present application can be implemented without some of these specific details. The following description of the embodiments is only to provide a better understanding of the present application by illustrating examples of the present application.

In an electronic device such as a cell phone or a tablet computer, a photosensitive component such as a front camera, an infrared light sensor, and a proximity light sensor needs be integrated at a side of the display panel. In some embodiments, a light-transmitting display area may be arranged on the electronic device and the photosensitive component can be arranged at the back of the light-transmitting display area, so as to achieve a full-screen display for the electronic device while ensuring the normal operation of the photosensitive component.

In order to increase the light transmittance of the light-transmitting area, at least two sub-pixels in the light-transmitting area are connected with a same driving circuit, thereby reducing the number of the driving circuits to be arranged and the distribution area of the metal materials.

Accordingly, a connection structure is arranged to connect the pixel electrodes of the at least two sub-pixels, while no connection structure is arranged in the normal display area, and the pixel electrodes in the normal display area can be directly deposited on a planarization layer. The pixel electrodes in the light-transmitting area are deposited on the connection structure, and different film layers will significantly affect the film quality of the pixel electrodes. For example, when a plurality of layer structures of the pixel electrode are deposited on the connection structure in sequence, the connection structure may affect silver ions in the underlying layer, and when the plurality of layer structures are deposited layer by layer to form the pixel electrode, defects may also accumulate and defects in the silver ions increase. In a subsequent high-temperature process, the silver ions in the pixel electrode will migrate to form holes which cannot reflect light, and the area where the silver ions do not migrate can normally reflect the light emitted by the light-emitting structure, and finally, a poor display effect such as yellowing of the display panel appears.

In order to solve the above problems, the embodiments of the present application provide a display panel, a display apparatus and a method for manufacturing a display panel, and various embodiments of the display panel and the display apparatus will be described below with reference to the accompanying drawings.

The embodiments of the present application provide a display panel which may be an organic light emitting diode (OLED) display panel.

Figure 2:
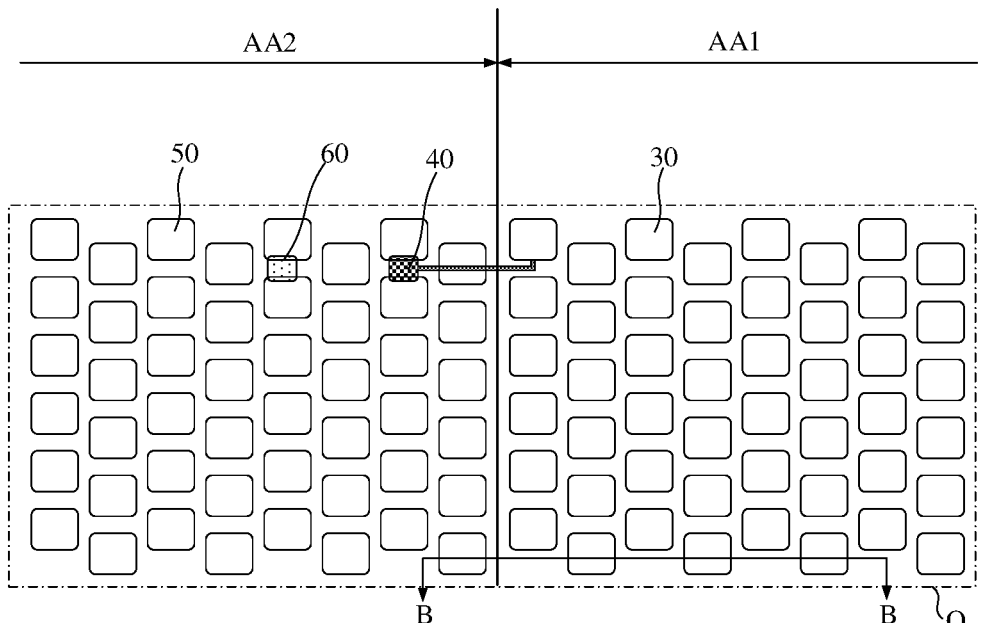
FIG. 2 shows a partial enlarged diagram of area Q in FIG. 1 in an example.
Figure 3:
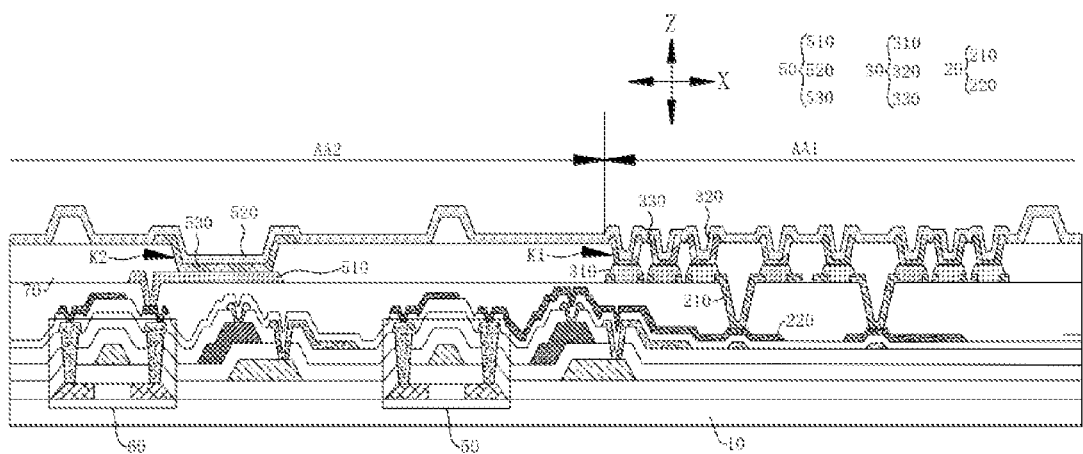
FIG. 3 shows a cross-sectional diagram along B-B in FIG. 2.

Referring to FIG. 1 to FIG. 3, FIG. 1 shows a schematic top view of a display panel 100 according to the embodiments of the present application, FIG. 2 shows a partial enlarged diagram of area Q in FIG. 1 in an example, and FIG. 3 shows a cross-sectional diagram along B-B in FIG. 2.

As shown in FIG. 1 to FIG. 3, the display panel 100 according to the embodiments of the first aspect of the present application includes: a base plate 10, and an interconnection structure 20 and a plurality of first sub-pixels 30 arranged on the base plate 10. The interconnection structure 20 is located at a side of the base plate 10, and includes at least two connection blocks 210 and connection lines 220 for connecting at least two of the connection blocks 210; and the first sub-pixels 30 are located at a side of the interconnection structure 20 away from the base plate 10 and each includes a first electrode 310, a first light-emitting structure 330 and a second electrode 320 stacked in sequence along a direction away from the interconnection structure 20; in which at least a part of the first electrode 310 is located at a side of the connection block 210 away from the base plate 10 and electrically connected with the connection block 210, and an orthographic projection of the connection block 210 on the base plate 10 is at least partially staggered with an orthographic projection of the first light-emitting structure 330 on the base plate 10.

In the display panel 100 according to the embodiments of the present application, the display panel 100 includes the base plate 10, and the interconnection structure 20 and the first sub-pixels 30 arranged on the base plate 10. The connection blocks 210 of the interconnection structure 20 are configured to connect the first electrodes 310 of the first sub-pixels 30, and the connection lines 220 of the interconnection structure 20 are configured to connect at least two connection blocks 210, so that the first electrodes 310 of at least two first sub-pixels 30 can be connected with each other through the interconnection structure 20. When a driving circuit is used to drive the first sub-pixels 30, the driving circuit can be connected with at least two first sub-pixels 30 through the interconnection structure 20, therefore the number of the driving circuits to be arranged can be reduced and the light transmittance of the display panel 100 can be increased, so that at least a part of the display panel 100 can be light-transmitting and can be used to display, facilitating the under-screen integration of the photosensitive components. In addition, the orthographic projection of the connection block 210 is at least partially staggered with the orthographic projection of the first light-emitting structure 330, that is, the first electrode 310 corresponding to at least a part of the first light-emitting structure 330 is staggered with, and does not contact, the connection block 210, so that the effect on display of the display panel 100 due to adding the connection blocks 210 can be reduced, and the display effect of the display panel 100 can be improved.

The base plate 10 may be arranged in various ways. Optionally, the base plate 10 includes a substrate, and the substrate may be made of a light-transmitting material such as glass and polyimide (PI). The base plate 10 may further include a support layer located at a side of the substrate away from an active layer, and the support layer may include a steel plate layer and/or a foam layer. A layer structure such as a buffer layer may be further arranged between the substrate and the active layer.

Optionally, the interconnection structure 20 may be arranged in all areas of the display panel 100, so as to increase the light transmittance of the entire display panel 100.

In some other embodiments, still referring to FIG. 1 and FIG. 2, the display panel 100 includes a first display area AA1, a second display area AA2, and a non-display area NA surrounding the first display area AA1 and the second display area AA2, and a light transmittance of the first display area AA1 is greater than a light transmittance of the second display area AA2. In other embodiments, the display panel 100 may not include the non-display area NA.

Herein, optionally, the light transmittance of the first display region AA1 is greater than or equal to 15%. In order to ensure that the light transmittance of the first display region AA1 is greater than 15%, or greater than 40%, or even a higher light transmittance, the light transmittances of various functional film layers of the display panel 100 in the embodiment are all greater than 80%, or even the light transmittances of at least a part of the functional film layers are greater than 90%.

In the display panel 100 according to the embodiments of the present application, the light transmittance of the first display region AA1 is greater than the light transmittance of the second display region AA2, so that the photosensitive component can be integrated at the back of the first display region AA1 of the display panel 100 to realize under-screen integration for the photosensitive component such as a camera, while the first display area AA1 can display the image, the display area of the display panel 100 is increased and a full-screen design is achieved for the display apparatus.

Optionally, still referring to FIG. 2 and FIG. 3, the first sub-pixels 30 and the interconnection structure 20 are located in the first display area AA1, so as to further increase the light transmittance of the first display area AA1 and facilitate the under-screen integration of the photosensitive module in the first display area AA1.

Optionally, still referring to FIG. 2 and FIG. 3, the display panel 100 further includes a first driving circuit 40 located in the second display area AA2, and the interconnection structure 20 is connected with the first driving circuit 40 through the connection lines 220.

In these optional embodiments, the first driving circuit 40 configured to drive the first sub-pixels 30 in the first display area AA1 to display is located in the second display area AA2, so that the distribution area of the metal materials in the first display area AA1 can be further reduced, and the light transmittance of the first display area AA1 is increased. The first driving circuit 40 is connected with the first electrodes 310 through the interconnection structure 20, so that the first driving circuit 40 can drive at least two first sub-pixels 30 to display, and the number of wirings in the first display area AA1 can be reduced, thereby reducing the distribution area of the metal materials in the first display area AA1 and increasing the light transmittance of the first display area AA1.

In FIG. 2, the position of one first driving circuit 40 is exemplarily depicted, and the first driving circuit 40 is electrically connected with a corresponding first sub-pixel 30. There may be a plurality of first driving circuits 40 which are respectively electrically connected with the corresponding first sub-pixels 30. In some embodiments, a circuit structure of the first driving circuit 40 is any one of a 2T1C circuit, a 7T1C circuit, a 7T2C circuit, and a 9T1C circuit. Herein, the "2T1C circuit" refers to a driving circuit including two thin film transistors (T) and one capacitor (C), and the same applies to the "7T1C circuit", the "7T2C circuit", the "9T1C circuit", and so on.

Optionally, still referring to FIG. 2 and FIG. 3, the display panel 100 further includes second sub-pixels 50 located in the second display area AA2 and a second driving circuit 60 configured to drive the second sub-pixels 50 to display. The second sub-pixel 50 includes a third electrode 510, a fourth electrode 520, and a second light-emitting structure 530 located between the third electrode 510 and the fourth electrode 520, and each third electrode 510 is directly connected with the second driving circuit 60 through a signal line.

The third electrode 510 of the second sub-pixel 50 is directly connected with the second driving circuit 60, while the first electrodes 310 of at least two first sub-pixels 30 are connected with the first driving circuit 40 through the interconnection structure 20, the layer structure of the interconnection structure 20 is added in the first display area AA1. Since the third electrode 510 may be directly deposited on the planarization layer, while at least a part of the first electrode 310 is deposited on the connection block 210, inconsistent display effect may occur between the first display area AA1 and the second display area AA2, causing display stripes between the first display area AA1 and the second display area AA2.

In the display panel 100 according to the embodiments of the present application, the orthographic projection of the connection block 210 on the base plate 10 is at least partially staggered with the orthographic projection of the first light-emitting structure 330 on the base plate 10, the overlapping area between the connection block 210 and the first light-emitting structure 330 can be reduced, thereby reducing the effect of the connection block 210 on display, eliminating the inconsistent display effect between the first display area AA1 and the second display area AA2, and in turn reducing the display stripes between the first display area AA1 and the second display area AA2.

In some embodiments, a size of the first sub-pixel 30 is less than a size of the second sub-pixel 50 of the same color as the first sub-pixel 30, so that the non-light-emitting area in the first display area AA1 is larger, thereby further increasing the light transmittance of the first display area AA1. In other embodiments, the size of the first sub-pixel 30 is not such limited, for example, the size of the first sub-pixel 30 is equal to the size of the second sub-pixel 50 of the same color as the first sub-pixel 30.

In some optional embodiments, the orthographic projection of the first light-emitting structure 330 on the base plate 10 is located within the orthographic projection of the first electrode 310 on the base plate 10, and the orthographic projection of the connection block 210 on the base plate 10 is at least partially staggered with the orthographic projection of the first electrode 310 on the base plate 10.

In these optional embodiments, the orthographic projection of the first light-emitting structure 330 on the base plate 10 is located within the orthographic projection of the first electrode 310 on the base plate 10, so as to ensure that a surface of the first light-emitting structure 330 facing the first electrode 310 entirely contacts the first electrode 310, therefore the contact area between the first light-emitting structure 330 and the first electrode 310 is increased, and the light-emitting effect of the first light-emitting structure 330 is improved. The orthographic projection of the connection block 210 on the base plate 10 is at least partially staggered with the orthographic projection of the first electrode 310 on the base plate 10, so that the connection block 210 can be staggered with the first light-emitting structure 330, thereby improving the display effect of the first display area AA1 and reducing the display stripes between the first display area AA1 and the second display area AA2.

Figure 4:
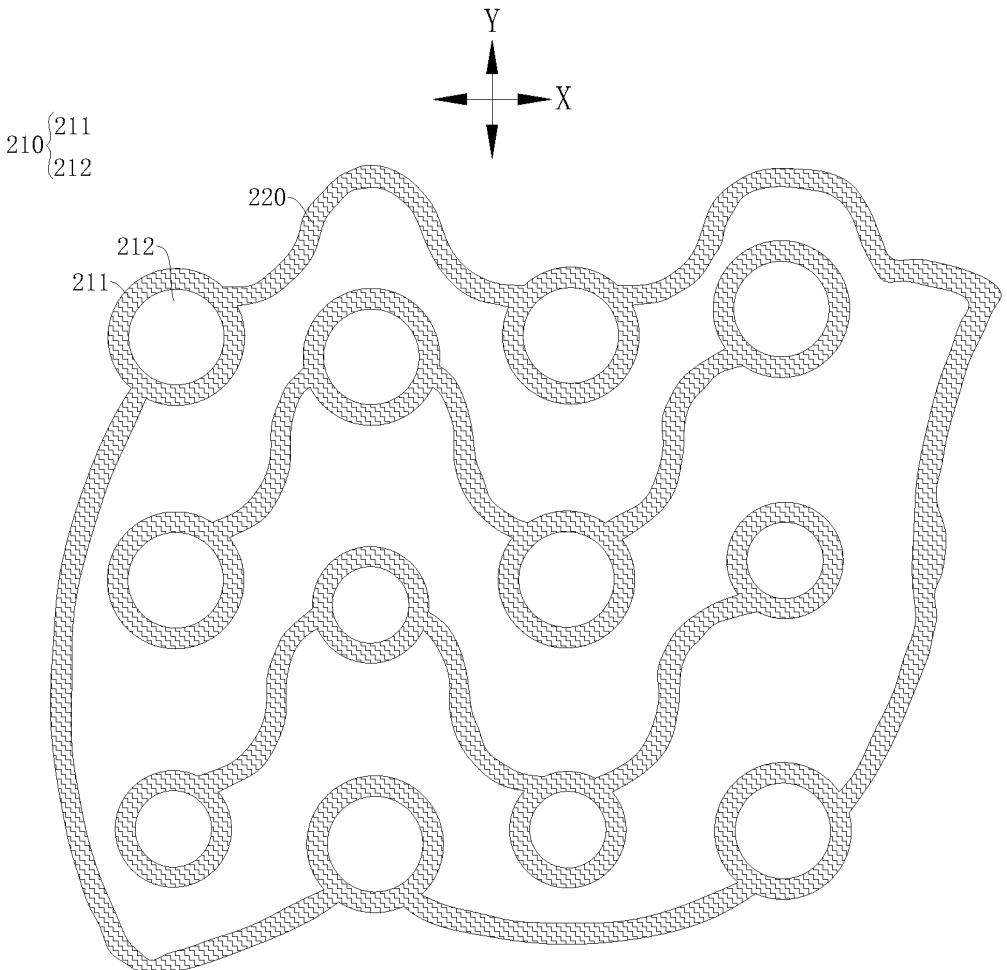
FIG. 4 shows a schematic structural diagram of an interconnection structure of a display panel according to the embodiments of the present application.
Figure 5:
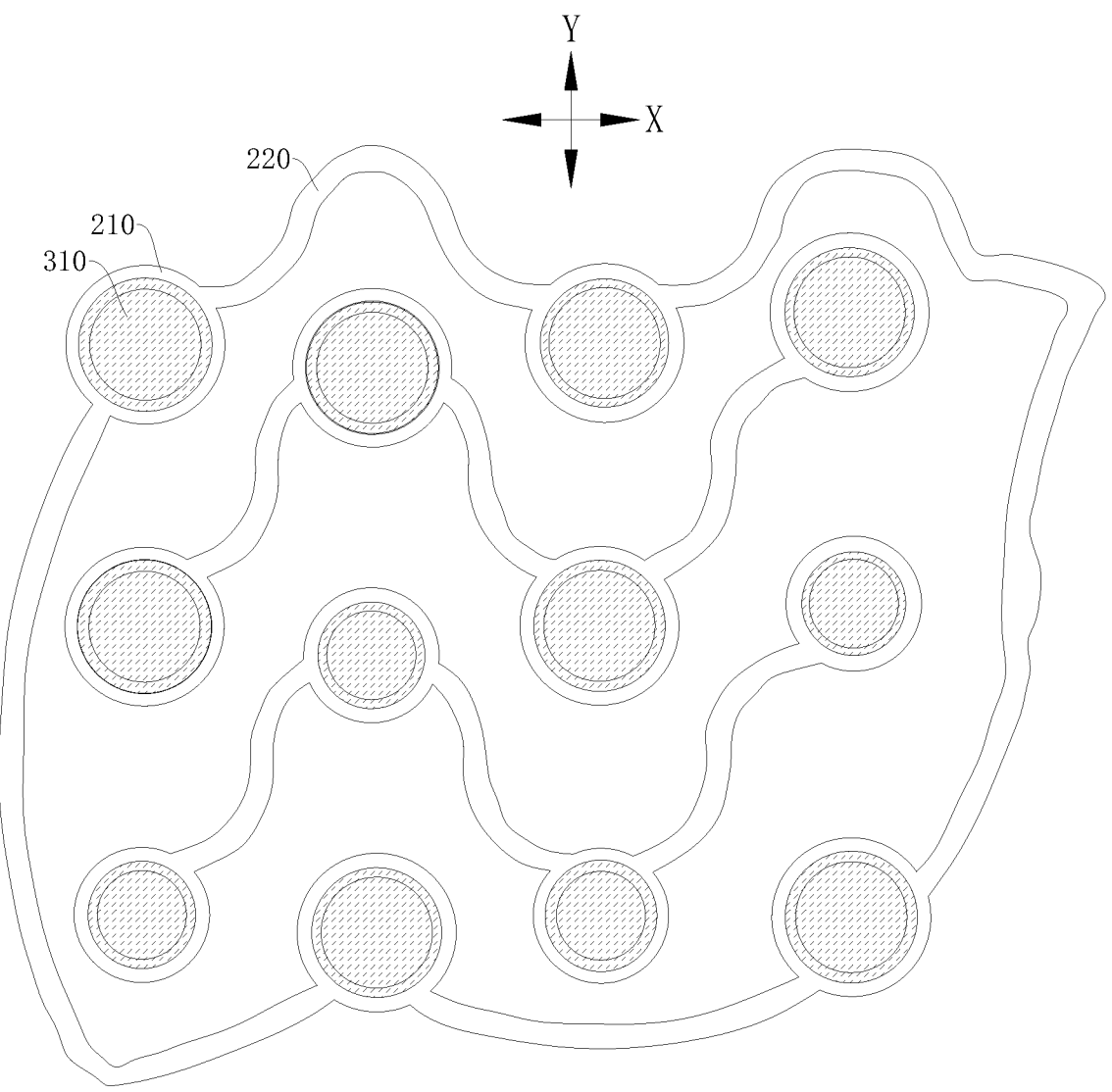
FIG. 5 shows a schematic structural diagram of relative positions of an interconnection structure and a first electrode of a display panel according to the embodiments of the present application.
Figure 6:
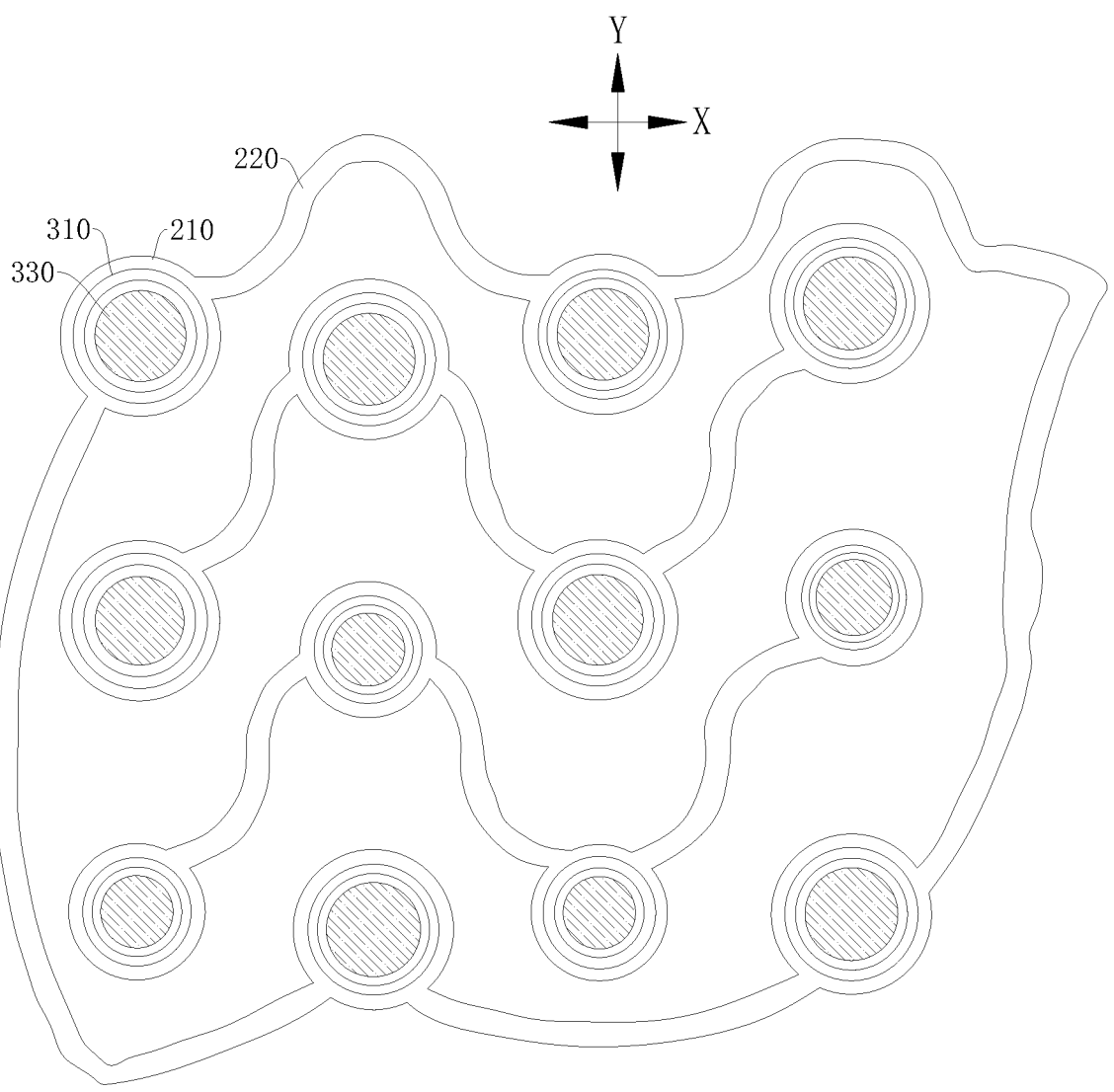
FIG. 6 shows a schematic structural diagram of relative positions of an interconnection structure, a first electrode and a first light-emitting structure of a display panel according to the embodiments of the present application.

The connection block 210 may be arranged in various ways. For example, the connection block 210 may be arranged surrounding the first light-emitting structure 330. Referring to FIG. 4 to FIG. 6. FIG. 4 shows a schematic structural diagram of an interconnection structure 20 of a display panel 100 according to the embodiments of the present application. FIG. 5 shows a schematic structural diagram of relative positions of an interconnection structure 20 and a first electrode 310 of a display panel 100 according to the embodiments of the present application. To better illustrate the structure of the display panel 100, filling patterns within the interconnection structure 20 are not shown in FIG. 5. FIG. 6 shows a schematic structural diagram of relative positions of an interconnection structure 20, a first electrode 310 and a first light-emitting structure 330 of a display panel 100 according to the embodiments of the present application. To better illustrate the structure of the display panel 100, filling patterns within the interconnection structure 20 and the first electrode 310 are not shown in FIG. 6.

In some optional embodiments, as shown in FIG. 4 to FIG. 6, the connection block 210 includes a body portion 211 and a hollow portion 212 enclosed by the body portion 211, and an orthographic projection of the hollow portion 212 on the base plate 10 at least partially overlaps the orthographic projection of the first light-emitting structure 330 on the base plate That is, an area enclosed by an inner edge of the orthographic projection of the body portion 211 on the base plate 10 at least partially overlaps the orthographic projection of the first light-emitting structure 330 on the base plate 10.

In these optional embodiments, the connection block 210 is ring-shaped and includes the body portion 211 and the hollow portion 212, and the area where the hollow portion 212 is located is not provided with the material of the interconnection structure 20, therefore if the orthographic projection of the hollow portion 212 on the base plate 10 at least partially overlaps the orthographic projection of the first light-emitting structure 330 on the base plate 10, the effect of the interconnection structure 20 on display can be reduced. Furthermore, the ring-shaped body portion 211 can further increase the contact area between the connection block 210 and the first electrode 310, so that stability of the electrical connection between the body portion 211 and the first electrode 310 can be increased.

Optionally, the orthographic projection of the first light-emitting structure 330 on the base plate 10 is located within the orthographic projection of the hollow portion 212 on the base plate 10, that is, the orthographic projection of the first light-emitting structure 330 on the base plate 10 is located within the area enclosed by the inner edge of the orthographic projection of the body portion 211 on the base plate 10, and the first light-emitting structure 330 is completely staggered with the body portion 211, therefore the effect of the interconnection structure 20 on display can be reduced, and the display stripes between the first display area AA1 and the second display area AA2 can be further reduced.

Figure 7:
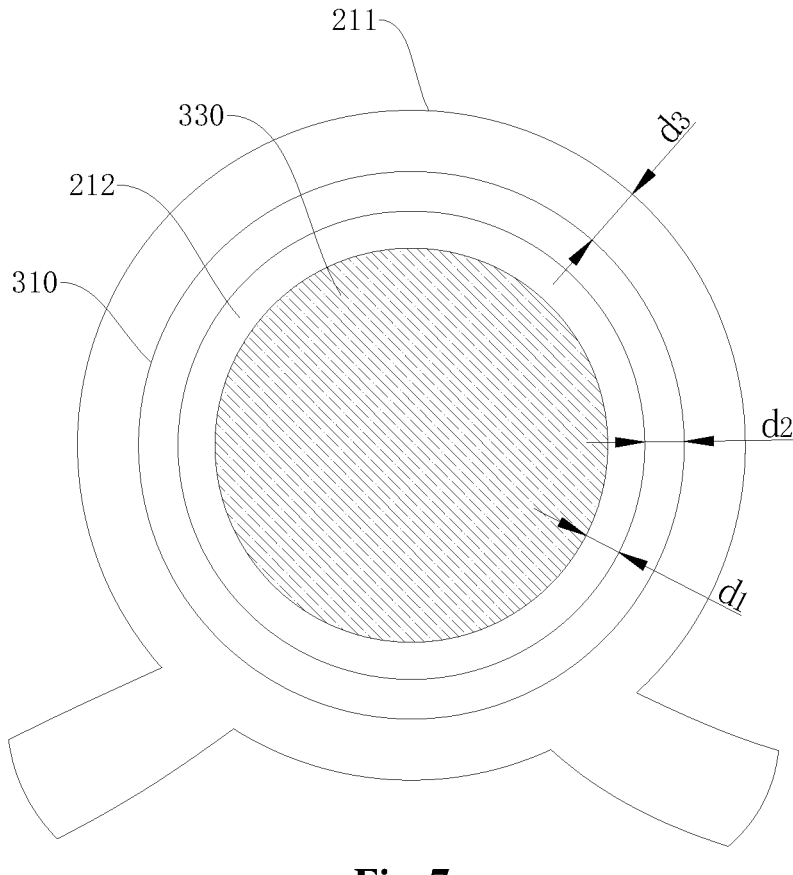
FIG. 7 shows a partial enlarged schematic structural diagram of FIG. 6.

Referring to FIG. 7, which shows a partial enlarged schematic structural diagram of FIG. 6.

Optionally, as shown in FIG. 7, a distance $d_1$ between an edge of the orthographic projection of the first light-emitting structure 330 on the base plate 10 and an edge of the orthographic projection of the hollow portion 212 on the base plate 10 is in a range from 0.5 µm to 1.5 µm, that is, a distance d 1 between the edge of the orthographic projection of the first light-emitting structure 330 on the base plate 10 and the inner edge of the orthographic projection of the body portion 211 on the base plate 10 is in a range from 0.5 µm to 1.5 µm. For example, the distance $d_1$ between the edge of the orthographic projection of the first light-emitting structure 330 on the base plate 10 and the edge of the orthographic projection of the hollow portion 212 on the base plate 10 is 1.0 µm. Manufacturing errors can be reduced to ensure that the first light-emitting structure 330 overlaps the body portion 211, and the display stripes between the first display area AA1 and the second display area AA2 can be further reduced.

In some optional embodiments, an orthographic projection of the body portion 211 on the base plate 10 at least partially overlaps an orthographic projection of the first electrode 310 on the base plate 10, so as to sure that the first electrode 310 and the body portion 211 can be electrically connected with each other, and that the first electrode 310 can be connected with the first driving circuit 40 through the interconnection structure 20.

Optionally, the orthographic projection of the hollow portion 212 on the base plate is located within the orthographic projection of the first electrode 310 on the base plate 10, that is, the area enclosed by the inner edge of the orthographic projection of the body portion 211 on the base plate 10 is located within the orthographic projection of the first electrode 310 on the base plate 10, so that the inner edge of the body portion 211 can be connected with the first electrode 310, the connect area between the first electrode 310 and the body portion 211 is increased, and stability of the electrical connection between the body portion 211 and the first electrode 310 can be ensured.

Optionally, a distance $d_2$ between an edge of the orthographic projection of the hollow portion 212 on the base plate 10 and an edge of the orthographic projection of the first electrode 310 on the base plate 10 is in a range from 1.0 µm to 3.5 µm, that is, a distance $d_2$ between the inner edge of the orthographic projection of the body portion 211 on the base plate and the edge of the orthographic projection of the first electrode 310 on the base plate 10 is in a range from 1.0

µm to 3.5 µm. For example, the distance $d_2$ between the inner edge of the orthographic projection of the body portion 211 on the base plate 10 and the edge of the orthographic projection of the first electrode 310 on the base plate 10 is 2 µm. That is, the orthographic projection of the first electrode 310 on the base plate 10 is located between the inner edge and outer edge of the orthographic projection of the body portion 211 on the base plate 10, so as to ensure a sufficient contact area between the first electrode 310 and the body portion 211 and stability of the electrical connection between the first electrode 310 and the body portion 211.

In some optional embodiments, an orthographic projection of the first electrode 310 on the base plate 10 is located within an area enclosed by an outer edge of the orthographic projection of the connection block 210 on the base plate 10. On the one hand, it can be avoided that the first electrode 310 is too large and affect the light transmittance of the first display area AA1. On the other hand, it can be ensured that the connection block 210 is relatively large to maintain a sufficient contact area between the connection block 210 and the first electrode 310.

Optionally, a distance $d_3$ between an edge of the orthographic projection of the first electrode 310 on the base plate 10 and the outer edge of the orthographic projection of the connection block 210 on the base plate 10 is in a range from 1.0 µm to 3.0 µm. For example, the distance $d_3$ between the edge of the orthographic projection of the first electrode 310 on the base plate 10 and the outer edge of the orthographic projection of the connection block 210 on the base plate 10 is 2.0 µm.

In these optional embodiments, if the distance between the edge of the orthographic projection of the first electrode 310 on the base plate 10 and the outer edge of the orthographic projection of the connection block 210 on the base plate 10 is within the above range, it can be avoided that the connection block 210 is too large and affect the light transmittance of the area where the connection block 210 is located, and that the connection block 210 is too small and affect the electrical connection between the connection block 210 and the first electrode 310.

In some embodiments, the connection line 220 may be connected with a first predetermined number of connection blocks 210, which may be two to eight. For example, the first predetermined number is four, that is, the first electrodes 310 of every four first sub-pixels 30 are electrically connected with each other through the interconnection structure 20. In some embodiments, the interconnection structure 20 and the first electrode 310 are arranged in a same layer. The interconnection structure 20 may be made of the same material as the first electrode 310, or may be made of other conductive materials.

In some optional embodiments, a material of at least one of the connection block 210 and the connection line 220 includes a light-transmitting conductive material, so as to increase the light transmittance of the first display area AA1. For example, the materials of both of the connection block 210 and the connection line 220 include a light-transmitting material, that is, the material of the interconnection structure 20 includes a light-transmitting material, so that the light transmittance of the first display area AA1 can be further increased. For example, the material of interconnection structure 20 includes indium tin oxide (ITO).

Optionally, the first light-emitting structures 330 corresponding to a plurality of connection blocks 210 connected by the connection line 220 emit lights of a same color. The first light-emitting structure 330 corresponding to the connection block 210 is the first light-emitting structure 330 located at a side of the first electrode 310 electrically connected with the connection block 210.

In some embodiments, still referring to FIG. 3, the display panel 100 includes a device layer and a pixel definition layer 70. The device layer is located on the base plate 10, and the first driving circuit 40 is located in the device layer. The pixel definition layer 70 is located on the device layer.

The device layer may include driving circuits configured to drive the various sub-pixels to display. The pixel definition layer 70 includes first pixel openings K1 located in the first display area AA1 and second pixel openings K2 located in the second display area AA2. The first light-emitting structure 330 is located within the first pixel opening K1, the first electrode 310 is located at a side of the first light-emitting structure 330 facing the base plate 10, and the second electrode 320 is located at a side of the first light-emitting structure 330 away from the base plate 10. One of the first electrode 310 and the second electrode 320 is an anode, and the other one is a cathode.

In some embodiments, the second light-emitting structure 530 is located within the second pixel opening K2, the third electrode 510 is located at a side of the second light-emitting structure 530 facing the base plate 10, and the fourth electrode 520 is located at a side of the second light-emitting structure 530 away from the base plate 10. One of the third electrode 510 and the fourth electrode 520 is an anode, and the other one is a cathode.

In the embodiment, for example, the first electrode 310 and the third electrode 510 are anodes, and the second electrode 320 and the fourth electrode 520 are cathodes.

The first light-emitting structure 330 and the second light-emitting structure 530 may respectively include an OLED light-emitting layer, and according to design requirements, the first light-emitting structure 330 and the second light-emitting structure 530 may further respectively include at least one of a hole inject layer, a hole transport layer, an electron inject layer, or an electron transport layer.

In some embodiments, the first electrode 310 is a light-transmitting electrode. In some embodiments, the first electrode 310 includes an ITO layer or an indium zinc oxide layer. In some embodiments, the first electrode 310 is a reflective electrode including a first light-transmitting conductive layer, a reflective layer on the first light-transmitting conductive layer, and a second light-transmitting conductive layer on the reflective layer. The first light-transmitting conductive layer and the second light-transmitting conductive layer may be ITO, indium zinc oxide, and the like, and the reflective layer may be a metal layer made of, for example, silver. The third electrode 510 may be made of the same material as the first electrode 310.

In some embodiments, the second electrode 320 includes a magnesium-silver alloy layer. The fourth electrode 520 may be made of the same material as the second electrode 320. In some embodiments, the second electrode 320 and the fourth electrode 520 may be interconnected as a common electrode.

In some embodiments, an orthographic projection of each first light-emitting structure 330 on the base plate 10 consists of one first graphic unit or two or more first graphic units jointed together, and the first graphic unit includes at least one selected from a group including a round shape, an oval shape, a dumb-bell shape, a gourd shape and a rectangle shape.

In some embodiments, an orthographic projection of each first electrode 310 on the base plate 10 consists of one second graphic unit or two or more second graphic units jointed together, and the second graphic unit includes at least one selected from a group including a round shape, an oval shape, a dumb-bell shape, a gourd shape and a rectangle shape.

Exemplarily, the display panel 100 may further include an encapsulation layer, and a polarizer and a cover plate located on the encapsulation layer. Alternatively, the cover plate may be directly arranged on the encapsulation layer without the polarizer, or at least the cover plate may be directly arranged on the encapsulation layer in the first display area AA1 without the polarizer, so as to prevent the polarizer from affecting the light collection amount of the photosensitive component correspondingly arranged under the first display area AA1. The polarizer may also be arranged on the encapsulation layer in the first display area AA1.

Embodiments of the present application further provide a display apparatus that may include the display panel 100 according to any of the above implementations. The display apparatus of an embodiment will be illustrated below as an example, in which the display apparatus includes the display panel 100 according to the above embodiments.

Figures 8, 9:
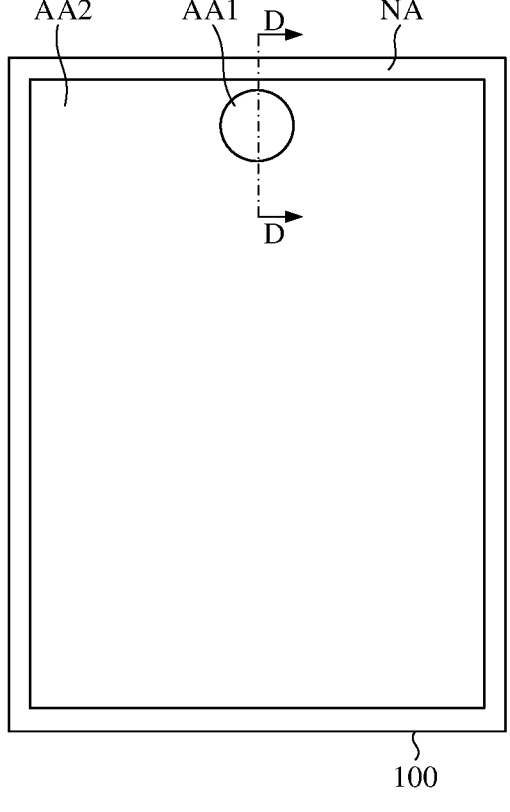
FIG. 8 shows a schematic top view of a display apparatus according to the embodiments of the present application.
FIG. 9 shows a cross-sectional diagram along D-D in FIG. 8.

FIG. 8 shows a schematic top view of a display apparatus according to the embodiments of the present application, and FIG. 9 shows a cross-sectional diagram along D-D in FIG. 8. In the display apparatus of the embodiment, the display panel 100 may be the display panel 100 according to one of the above embodiments, the display panel 100 includes the first display area AA1 and the second display area AA2, and the light transmittance of the first display area AA1 is greater than the light transmittance of the second display area AA2.

The display panel 100 includes a first surface S1 and a second surface S2 opposite to each other, in which the first surface S1 is the display surface. The display apparatus further includes a photosensitive component 200 located at side of the display panel 100 corresponding to the second surface S2, and the photosensitive component 200 corresponds to the position of the first display area AA1.

The photosensitive component 200 may be an image capturing apparatus for capturing external image information. In the embodiment, the photosensitive component 200 is a complementary metal oxide semiconductor (CMOS) image capturing apparatus, and in some other embodiments, the photosensitive component 200 may be other image capturing apparatus such as a charge-coupled device (CCD) image capturing apparatus. It should be understood that the photosensitive component 200 may not be limited to an image capturing apparatus, for example, in some embodiments, the photosensitive component 200 may be a light sensor such as an infrared sensor, a proximity sensor, an infrared lens, a flood sensing element, an ambient light sensor, and a dot projector. In addition, other components such as a telephone receiver and a speaker may be integrated at the second surface S2 of the display panel 100 of the display apparatus.

According to the display apparatus of the embodiments of the present application, the light transmittance of the first display area AA1 is greater than the light transmittance of the second display area AA2, so that the photosensitive component 200 can be integrated at the back of the first display area of the display panel 100 to achieve under-screen integration for the photosensitive component 200 such as an image capturing apparatus, while the first display area AA1 can display the image, the display area of the display panel 100 is increased and a full-screen design is achieved for the display apparatus.

Referring to FIG. 10, which shows a flow diagram of a method for manufacturing a display panel 100 according to the embodiments of the present application, and the display panel 100 may be the display panel 100 according to any of the above embodiments of the first aspect.

As shown in FIG. 10 and referring to FIG. 1 to FIG. 7 together, the method for manufacturing the display panel 100 includes:

Step S01: coating a conductive material on the base plate 10 to form a conductive material layer.

Step S02: patterning the conductive material layer to form the interconnection structure 20 including at least two connection blocks 210 and connection lines 220 for connecting the at least two connection blocks 210.

Step S03: manufacturing the first electrode 310 at a side of the interconnection structure 20 away from the base plate 10, and the first electrode 310 being electrically connected with the connection block 210.

Step S04: manufacturing the first light-emitting structure 330 at a side of the first electrode 310 away from the base plate 10.

Step S05: manufacturing the second electrode 320 at a side of the first light-emitting structure 330 away from the base plate 10, so that the first electrode 310, the first light-emitting structure 330 and the second electrode 320 form the first sub-pixel 30, and the orthographic projection of the connection block 210 on the base plate 10 is at least partially staggered with the orthographic projection of the first light-emitting structure 330 on the base plate 10.

In the display panel 100 manufactured according to the method provided in the embodiments of the present application, the interconnection structure 20 is formed through steps S01 and S02 before the first electrode 310 is manufactured, so that at least two first electrodes 310 of the display panel 100 can be connected with each other through the interconnection structure 20. When a driving circuit is used to drive the first sub-pixels 30, the driving circuit can be connected with at least two first sub-pixels 30 through the interconnection structure 20, therefore the number of the driving circuits to be arranged can be reduced and the light transmittance of the display panel 100 can be increased, so that at least a part of the display panel 100 can be light-transmitting and can be used to display, facilitating the under-screen integration of the photosensitive components. In addition, the orthographic projection of the connection block 210 is at least partially staggered with the orthographic projection of the first light-emitting structure 330, so that the effect on display due to adding the connection blocks 210 can be reduced, and the display effect of the display panel 100 can be improved.

Optionally, if the display panel 100 includes the first display area AA1 and the second display area AA2, and the first sub-pixels 30 are located in the first display area AA1, the interconnection structure may be formed in the first display area AA1, so as to increase the light transmittance of the first display area AA1.

The above embodiments of the present application do not exhaustively describe all the details, nor do they limit the present application to the specific embodiments as described. Obviously, according to the above description, many modifications and changes can be made. These embodiments are selected and specifically described in the specification to better explain the principles and practical applications of the present application, so that those skilled in the art can make good use of the present application and make modifications based on the present application. The present application is limited only by the claims and the full scope and equivalents of the claims.

What is claimed is:

1. A display panel, comprising:

a base plate;

an interconnection structure located at a side of the base plate and comprising at least two connection blocks and connection lines for connecting the at least two connection blocks; and a plurality of first sub-pixels located at a side of the interconnection structure away from the base plate and each first sub-pixel comprising a first electrode, a first light-emitting structure and a second electrode stacked in sequence along a direction away from the interconnection structure, wherein:

at least a part of the first electrode is located at a side of the connection block away from the base plate and electrically connected with the connection block away from the base plate, an orthographic projection of the connection block on the base plate is at least partially staggered with an orthographic projection of the first light-emitting structure on the base plate, each connection block of the at least two connection blocks comprises a body portion and a hollow portion enclosed by the body portion, and an orthographic projection of the hollow portion on the base plate at least partially overlaps the orthographic projection of the first light-emitting structure on the base plate.

2. The display panel according to claim 1, wherein the orthographic projection of the first light-emitting structure on the base plate is located within an orthographic projection of the first electrode on the base plate, and the orthographic projection of the connection block on the base plate is at least partially staggered with the orthographic projection of the first electrode on the base plate.

3. The display panel according to claim 1, wherein the orthographic projection of the first light-emitting structure on the base plate is located within the orthographic projection of the hollow portion on the base plate.

4. The display panel according to claim 3, wherein a distance between an edge of the orthographic projection of the first light-emitting structure on the base plate and an edge of the orthographic projection of the hollow portion on the base plate is in a range from 0.5 μm to 1.5 μm.

5. The display panel according to claim 1, wherein an orthographic projection of the body portion on the base plate at least partially overlaps an orthographic projection of the first electrode on the base plate.

6. The display panel according to claim 1, wherein the orthographic projection of the hollow portion on the base plate is located within an orthographic projection of the first electrode on the base plate.

7. The display panel according to claim 6, wherein a distance between an edge of the orthographic projection of the hollow portion on the base plate and an edge of the orthographic projection of the first electrode on the base plate is in a range from 1.0 μm to 3.5 μm.

8. The display panel according to claim 1, wherein an orthographic projection of the first electrode on the base plate is located within an area enclosed by an outer edge of the orthographic projection of the connection block on the base plate.

9. The display panel according to claim 8, wherein a distance between an edge of the orthographic projection of the first electrode on the base plate and the outer edge of the orthographic projection of the connection block on the base plate is in a range from 1.0 μm to 3.0 μm.

10. The display panel according to claim 1, wherein a material of at least one of the connection block and the connection line comprises a light-transmitting conductive material.

11. The display panel according to claim 10, wherein at least a portion of the connection block and the connection line are arranged in a same layer and made of a same material, and materials of the portion of the connection block and the connection line both comprise a light-transmitting material.

12. The display panel according to claim 1, further comprising:

a first display area and a second display area, wherein a light transmittance of the first display area is greater than a light transmittance of the second display area, and the interconnection structure and the first sub-pixels are located in the first display area; and a first driving circuit located in the second display area, wherein the interconnection structure is connected with the first driving circuit through the connection lines.

13. The display panel according to claim 12, further comprising:

second sub-pixels located in the second display area; and a second driving circuit configured to drive the second sub-pixels to display, wherein each second sub-pixel comprises a third electrode, a fourth electrode, and a second light-emitting structure located between the third electrode and the fourth electrode, and each third electrode is directly connected with the second driving circuit through a signal line.

14. The display panel according to claim 1, wherein the connection line is configured to connect four connection blocks, and first light-emitting structures corresponding to the four connection blocks emit lights of a same color.

15. A display apparatus, comprising the display panel according to claim 1.

* * * * *